United States Patent
Chung et al.

(10) Patent No.: US 7,230,417 B2
(45) Date of Patent: Jun. 12, 2007

(54) TEST SYSTEM OF SEMICONDUCTOR DEVICE HAVING A HANDLER REMOTE CONTROL AND METHOD OF OPERATING THE SAME

(75) Inventors: Ae-Yong Chung, Chungcheongnam-do (KR); Eun-Seok Lee, Chungcheongnam-do (KR); Jeong-Ho Bang, Gyeonggi-do (KR); Kyeong-Seon Shin, Gyeonggi-do (KR); Dae-Gab Chi, Gyeonggi-do (KR); Sung-Ok Kim, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/252,448

(22) Filed: Oct. 17, 2005

(65) Prior Publication Data
US 2006/0158211 A1 Jul. 20, 2006

(30) Foreign Application Priority Data
Oct. 21, 2004 (KR) ............ 10-2004-0084396

(51) Int. Cl.
*G01R 31/28* (2006.01)
(52) U.S. Cl. .................................. 324/158.1
(58) Field of Classification Search ............ None
See application file for complete search history.

(56) References Cited

U.S. PATENT DOCUMENTS
6,225,798 B1  5/2001  Onishi et al.

FOREIGN PATENT DOCUMENTS
JP  6-230080  8/1994
JP  11-344528  12/1999
KR  2001-0024015  3/2001

OTHER PUBLICATIONS
English translation of Office Action received from Korean Intellectual Property Office dated Apr. 7, 2006.

*Primary Examiner*—Ha Tran Nguyen
*Assistant Examiner*—Trung Q. Nguyen
(74) *Attorney, Agent, or Firm*—Marger Johnson & McCollom, P.C.

(57) ABSTRACT

A test system of a semiconductor device for a handler remote control is provided. The system includes: a tester for testing the semiconductor device; a handler connected to the tester through a GPIB (General Purpose Instruction Bus) communication cable; a tester server connected to the tester to download a test program, handler remote control program and a handler state check program to the tester; and communication data transmitted and received through the GPIB communication cable between the tester and the handler, wherein the communication data has basic communication data for an electrical test of the semiconductor device, communication data for the handler remote control, and communication data for a handler state check.

23 Claims, 4 Drawing Sheets

TEST SYSTEM OF SEMICONDUCTOR DEVICE HAVING A HANDLER REMOTE CONTROL AND METHOD OF OPERATING THE SAME

BACKGROUND OF THE INVENTION

This application claims the benefit and priority of Korean Patent Application No. 10-2004-0084396, filed on Oct. 21, 2004, the disclosure of which is herein incorporated by reference in its entirety.

1. Field of the Invention

The invention relates to an electrical test system for a semiconductor device, and more particularly, to a test system for a semiconductor device having a handler remote control and an operation method of operating the same.

2. Description of the Related Art

A test process of a semiconductor device refers to a process of electrically testing a function of a completely manufactured semiconductor device in a wafer state or a package state. Equipment used in the electrical test process of the semiconductor device can include a tester server, a tester, a handler and the like.

The tester tests Direct Current (DC) and Alternate Current (AC) characteristics and a function characteristic of the semiconductor device by using a measurement system controlled by a Central Processing Unit (CPU). The handler refers to an automatic robot equipment for providing an external condition, such as temperature, to electrically test the semiconductor device, for automatically moving the semiconductor device under electrical test, and for sorting the semiconductor device according to the electrical test result. The tester server refers to computer equipment for downloading a test program to a plurality of testers and collecting the test results from each of the testers.

The tester and the handler are very high cost equipment compared to other equipment used in the manufacturing process of semiconductor devices. Accordingly, since efficiency of the electrical test process of the semiconductor device is directly related to the market competitiveness of the device, manufacturers of semiconductor devices are interested in methods for increasing the efficiency of the test.

FIG. 1 is a block diagram illustrating a conventional test system of the semiconductor device.

Referring to FIG. 1, to perform an electrical test for a semiconductor device using a conventional system, a test program suitable for a Device Under Test (DUT) is downloaded from a tester server 20 to a tester 10. When an electrical test for one semiconductor device is completed, the test result is transmitted to a handler 30. When an electrical test for an entire lot is completed, the electrical test result is again uploaded, this time to the tester server 20.

The tester 10 and the handler 30 are connected with each other using a General Purpose Instruction Bus (GPIB) communication cable for transmitting and receiving communication data for the electrical test of the semiconductor device. The transmitted and received data comprise basic communication data necessary for the electrical test of the semiconductor device. The basic communication data include a test start signal and a test end signal for the DUT, a category bin depending on the test results, an error signal, and the like. In cases where the electrical test is performed in parallel, the basic communication data includes a signal for the number of the DUTs concurrently tested, a mapping signal for the DUT included in a tray, and the like.

FIG. 2 is a flowchart illustrating an electrical test using the conventional test system of a semiconductor device of FIG. 1.

Referring to FIG. 2, an operator inputs the number of lots including the target DUT by using a control console of the tester (S10). The tester downloads a test program suitable for the lot number, from the tester server (S20). The operator then sets a handler control condition (for example, a soak time, a retest condition, a test temperature, a category bin site and the like) to the handler connected with the tester (S30).

The soak time, in cases where the semiconductor device is electrically tested at a high temperature or at a low temperature, refers to a wait time of the semiconductor device at a specific high temperature or low temperature for a predetermined time. The setting of the category bin site refers to sorting and storing the semiconductor device after completing the electrical test for the semiconductor device. For example, after the electrical test, the semiconductor device may be sorted as follows: a passed device may be defined as bin1, an Alternate Current (AC) characteristic failed device may be defined as bin2, a function characteristic failed device may be defined as bin3, and a Direct Current (DC) characteristic failed device may be defined as bin4. Then, the handler designates sites at which the bins, bin1 to bin4, are stored. Such designation of each of the storage sites of the bins is called "category bin site setting".

The retest condition refers to a condition for a retest performed for a poor-characteristic bin as designated by the handler, and the test temperature setting refers to the setting of the high temperature or the low temperature at which the semiconductor device is electrically tested.

In the conventional test system as shown in FIG. 1, the handler 30 does not directly communicate with the tester server 20. Moreoever, the handler 30 is only connected with the tester 10 to transmit and receive basic communication data. Additionally, the handler 30 is not connected in a networking structure. Accordingly, an operator must manually manipulate a variety of control items for the handler. The handler 30 has an independent CPU to control its internal robot unit. While a general tester 10 has a very high utilization of the CPU at a percentage of 90 to 100, the handler 30, although a high-priced equipment, has an apparently low utilization of its internal CPU at a percentage of 70 to 80.

In such an operation environment of the test system, it takes a much longer time for an operator to manually set a handler control condition than for a system to automatically set the handler control condition. Accordingly, in the electrical test process of the semiconductor device requiring manual setting of a handler, efficiency of the electrical test is deteriorated. Further, the handler control condition manipulated by the operator has a high probability of error caused by the operator, thereby decreasing the accuracy of the test process. Additionally, due to a shortage of data collection for problems occurring in the handler, the conventional test system can also have a drawback in that the handler cannot be effectively maintained at an appropriate time.

SUMMARY OF THE INVENTION

The invention provides a test system for a semiconductor device having a handler remote control.

Also, the invention provides an operation method of a test system for a semiconductor device having a handler remote control.

According to an aspect of the invention, a test system for a semiconductor device having a handler remote control comprises: a tester for testing the semiconductor device; a handler connected to the tester through a GPIB (General Purpose Instruction Bus) communication cable; a tester server connected to the tester to download a test program, handler remote control program and handler state check program to the tester; and communication data transmitted and received through the GPIB communication cable between the tester and the handler, wherein the communication data has basic communication data for an electrical test of the semiconductor device, communication data for the handler remote control, and communication data for a handler state check.

The communication data for the handler remote control may have a soak time setting data, a set condition for a retest, a set condition for a test temperature, a set condition for a category bin and a set condition for a loading time.

The communication data for the handler state check may have a handler jam data, error and alarm data of the handler, sorting data of the handler and a temperature stability data of the handler.

According to another aspect of the invention, a method for testing a semiconductor device comprises: searching a tester server for data to input a lot number of the target semiconductor device by using a control console of a tester; downloading a test program suitable to a lot of the target semiconductor device, from the tester server to the tester; downloading a handler remote control program and a handler state check program suitable to the lot of the target semiconductor device, from the tester server to the tester; remotely setting an operation condition of the handler by using the handler remote control program; and performing an electrical test for the semiconductor device by using the test program while checking a handler state by using the handler state check program.

The data for the handler state check may be periodically checked during the electrical test for the semiconductor device or be nonperiodically transmitted from the handler to the tester when the handler malfunctions.

The method may further include: constructing a database by using the collected handler state check data in the tester server after the electrical test and the checking of the handler state are performed.

According to the invention, the handler control condition is set in the remote control way by using the GPIB communication cable, not the operator, in the electrical test system of the semiconductor device. Accordingly, firstly, the handler control item can be set in the system automatic way, to increase the utilization of the handler CPU and reduce the test time, thereby increasing the test efficiency. Secondly, the error caused by the operator in the process of setting the handler control item can be suppressed. Thirdly, the problems caused in the handler are collected as the handler state check data to construct the database, thereby more effectively monitor and maintain the state of the handler.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF THE EMBODIMENTS

The invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
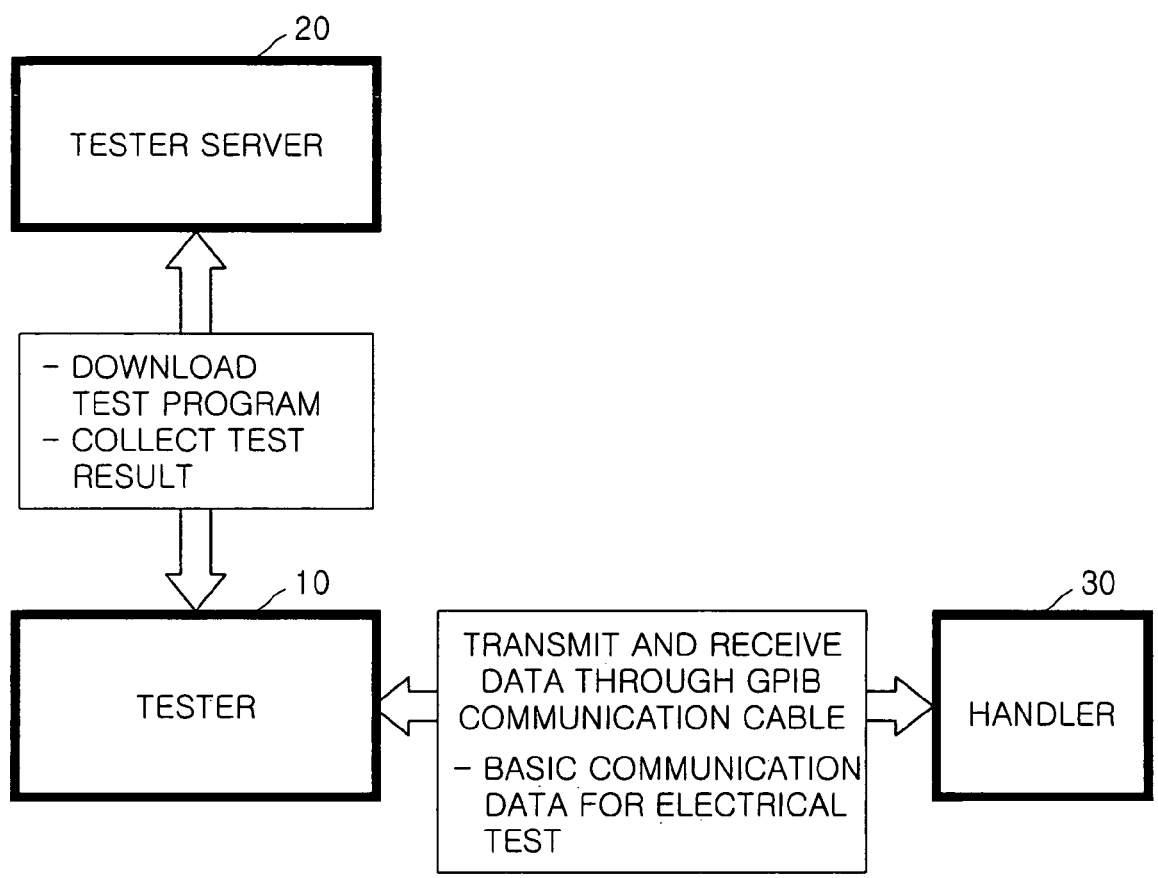
FIG. 1 is a block diagram illustrating a conventional test system for a semiconductor device.
Figure 2:
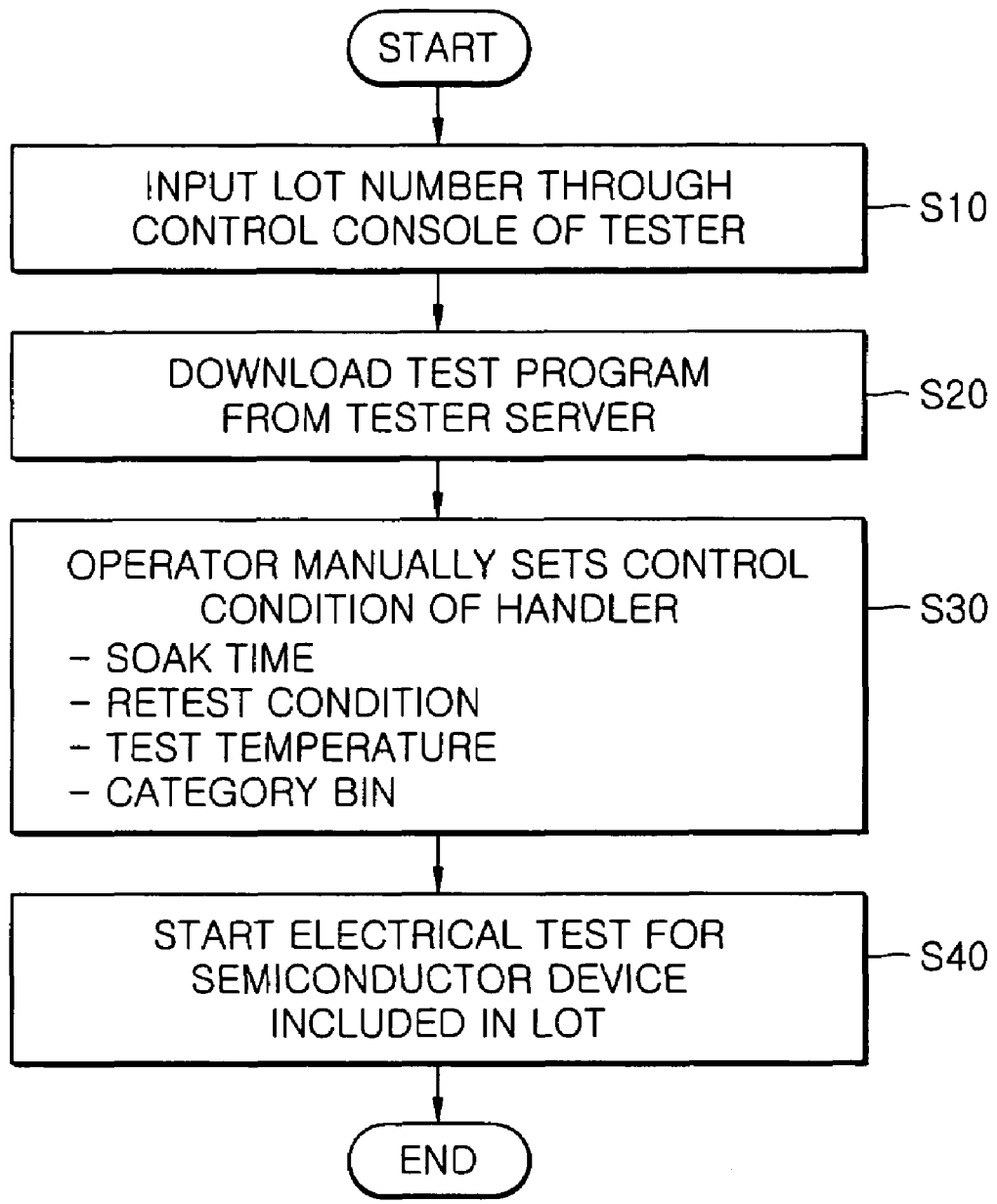
FIG. 2 is a flowchart illustrating a conventional electrical test in a test system for a semiconductor device.
Figure 3:
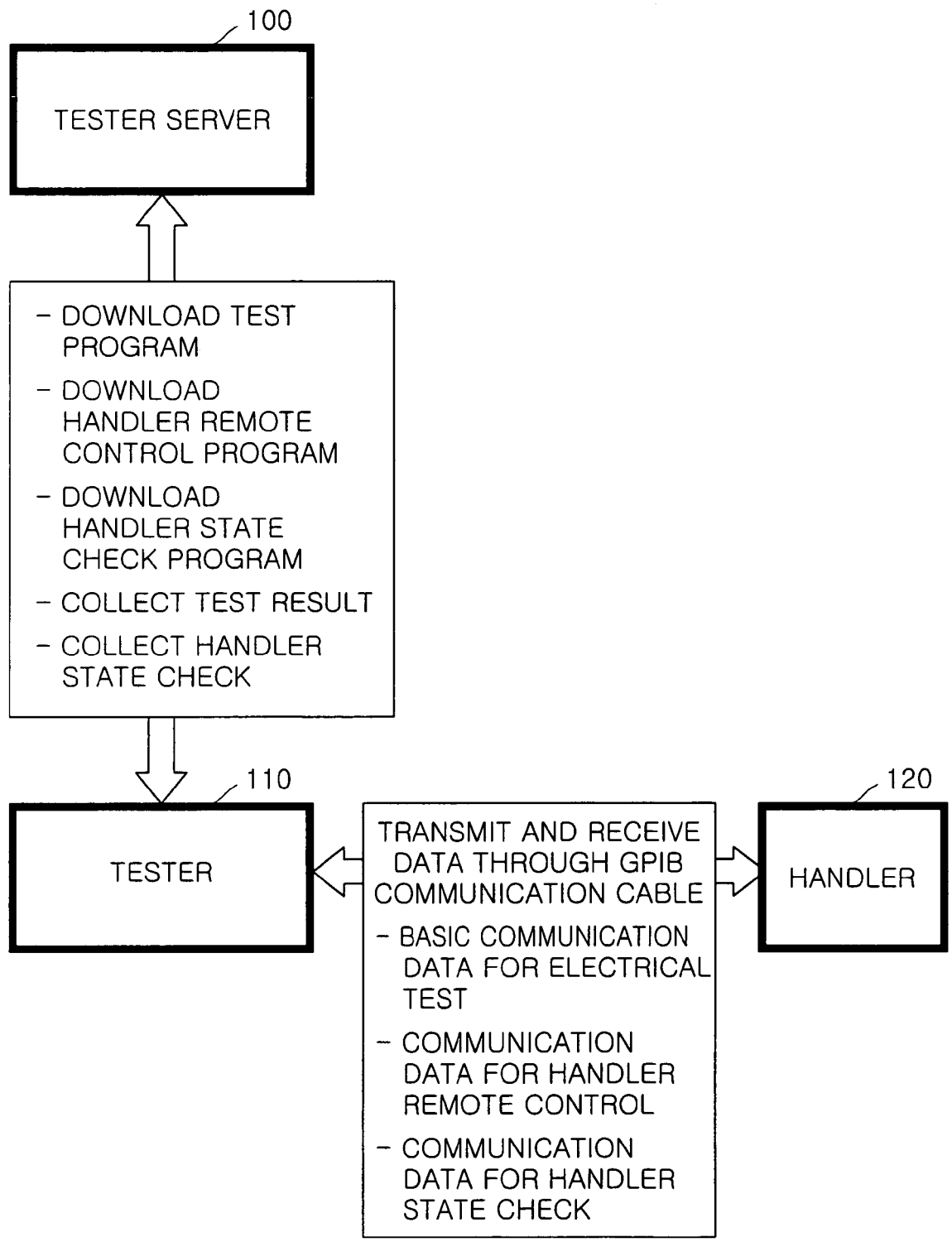
FIG. 3 is a block diagram illustrating a test system for a semiconductor device having a handler remote control according to the invention.

FIG. 3 is a block diagram illustrating a test system for a semiconductor device having a handler remote control according to the invention.

Referring to FIG. 3, to perform an electrical test on a semiconductor device, a tester 110 downloads a test program corresponding to a Device Under Test (DUT) from a tester server 100. The tester 110 downloads not only the test program, but also a handler remote control program and a handler state check program. When the electrical test for one semiconductor device is completed, the test result is transmitted to a handler 120. When the electrical test for an entire lot is finished, the test result is again uploaded, this time to the tester server 100. Further, the tester 110 also uploads a handler state check result, which is collected using the handler state check program, to the tester server 100.

The tester 110 and the handler 120 are connected with each other using a General Purpose Instruction Bus (GPIB) communication cable to transmit and receive data necessary for the electrical test of the semiconductor device. In the test system according to the invention, the basic communication data for the electrical test includes not only transmitted and received data as in the conventional test system, such as a test start signal and a test end signal for the DUT, an error signal and a category bin signal depending on the test results, but also communication data for the handler remote control and the handler state check.

Protocols using the GPIB communication cable to transmit and receive the communication data for the handler remote control and the communication data for the handler state check may be implemented in various ways in software.

The communication data for the handler remote control includes a soak time setting data, a set condition for a retest, a set condition for a test temperature, a set condition for a category bin, and the like. The communication data for the handler remote control can further include a set condition for a loading time, a condition for a remnant lot, a set condition for an auto restart, a set condition for a retest on/off, and the like.

The set condition for the loading time means the time taken to transport the semiconductor device, which is disposed at an ordinary tray, to another tray used for the test, and then starting the electrical test for the semiconductor device in the handler 120.

The condition for the remnant lot is described as follows. Assuming that 800 units of semiconductor devices are provided in one slot and the capacity of a parallel-test socket board for the unit semiconductor devices tested at one time is 256 in number. Then, at a fourth test, only the remaining 32 semiconductor devices are tested. However, in cases where the number of the semiconductor devices tested at one time is less than a predetermined number as described above, for example, in case where only one or two semiconductor devices are provided, the one or two semiconductor devices are not tested. Thus, the condition for the remnant lot refers to the setting of the number of the semiconductor devices including the one or two semiconductor devices, which are not tested and, instead, are included in a later retest process.

The set condition for the auto restart applies when two handlers are operated at the same time to enhance the efficiency of the test. In cases where two handlers are connected to one tester to perform the electrical test for the semiconductor device in parallel, a test start signal for one handler is delayed according to need.

The retest on/off condition is described as follows. In cases where the handler performs a retest of a specific bin (for example, a bin4 failed device being a DC failed device) two times, a yield of passed devices is obtained in the retest. For example, if a retest of 100 of bin4 failed devices results in 20 passed devices, it may be desirable that the retest is performed. However, if a retest of 100 of bin4 failed devices results in not even one passed device, it may not be required to perform the retest. In this case, a specific yield is set for the retest through the retest on/off condition.

As described above, the handler remote control program is downloaded from the tester server 100 and the downloaded handler remote control program is used to remotely control the handler in the tester server 110 so that a handler control condition can be set automatically, rather than manually by an operator. Accordingly, the utilization of a handler CPU can be increased, and a test time can be reduced to increase the test efficiency. Additionally, errors caused when the operator manually sets the handler control conditions can be avoided by using the automatic system.

The handler state check program comprises communication data that can include handler jam data, handler error and alarm data, handler sorting data, handler temperature stability data, and the like.

The handler jam data and error/alarm data is described as follows. During the process of using the handler to transport or dispose the semiconductor device at a predetermined position, a mechanical malfunction may occur. The malfunction may be caused by a mechanical defect of a robot unit of the handler or by an external defect of the semiconductor device. In some cases, the mechanical malfunction may be solved through a program execution of the CPU of the handler. However, in cases where the mechanical malfunction cannot be solved through the program execution of the CPU of the handler, the handler generates an error signal while sounding an alarm to inform the operator of the mechanical malfunction. As aforementioned, the jam data and the error/alarm data are transmitted from the handler to the tester.

The sorting data is described as follows. When one lot is electrically tested in the handler, the number of the semiconductor devices in each of the bins is transmitted to the tester. Since the remnant semiconductor devices not removed from the handler can be included in other lots to be subsequently tested, the devices are mixed with one another, thereby causing a critical defect. Accordingly, a drawback in the conventional test system, in which the operator does not remove all of the tested devices from the handler, is solved.

Finally, the temperature stability data is described as follows. In cases where the electrical test for the semiconductor device is performed at a specific temperature (for example, a low temperature of −0° C.), continuous maintenance of −0° C. can be varied due to an irregular supply of a cooling gas, such as nitrogen. That is, the temperature stability data refers to variations to the set test temperature.

As described above, the jam, alarm, sorting data and the temperature stability data generated at the handler 120 are transmitted from the handler 120 to the tester 110 so that the tester server 100 can construct and utilize a database to more effectively monitor and maintain the state of the handler 120.

Figure 4:
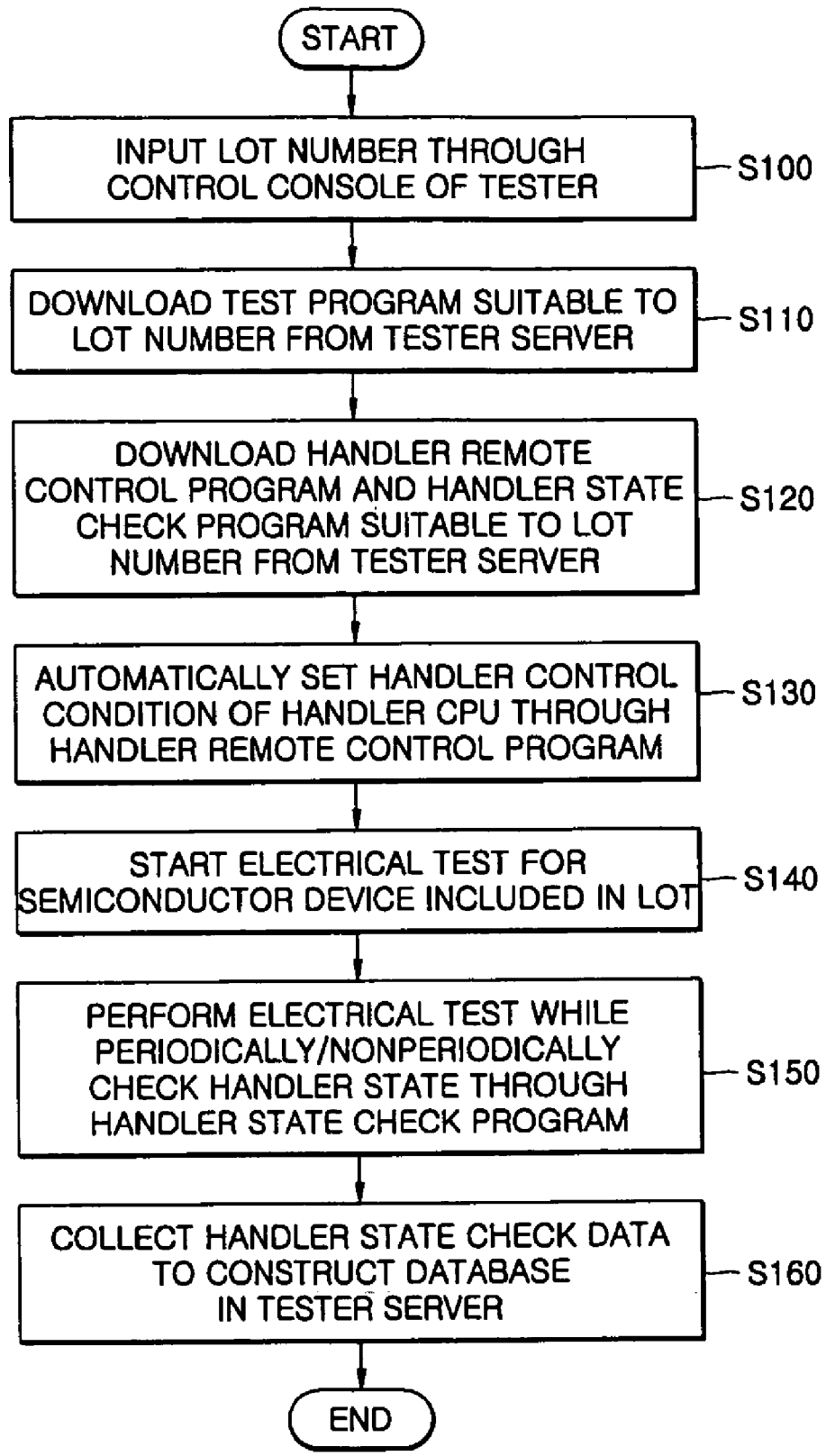
FIG. 4 is a flowchart illustrating an operation method of a test system for a semiconductor device having a handler remote control according to the invention.

FIG. 4 is a flowchart illustrating an operation method of the test system of the semiconductor device for the handler remote control according to the invention.

Referring to FIG. 4, the lot number of the test-target semiconductor device is inputted using the control console of the tester (S100). The tester downloads the test program corresponding to the lot number of the test-target semiconductor device, from the tester server (S110). In the invention, the tester also downloads the handler remote control program and the handler state check program, from the tester server (S120). In one embodiment, the handler remote control program and the handler state check program can be in the form of an independent program, separate from the test program. In another embodiment, the handler remote control program and the handler state check program can be in the form of an accessory program attached to the test program.

After the test program, the handler remote control program, and the handler state check program are downloaded to the tester, the tester executes the handler remote control program to transmit the communication data for the handler remote control to the handler CPU by using the GPIB communication cable connected to the handler. The handler CPU uses the received communication data to automatically set the handler control conditions (S130). The invention is not limited to using the GPIB communication cable and other embodiments may use a similar communication line.

The tester then starts the electrical test for the target semiconductor device disposed in the lot (S140). While the electrical test for the semiconductor device is being performed, the handler state check program may be executed, either periodically or nonperiodically, to check the jam, alarm, sorting data and the temperature stability data, which are generated from the handler (S150). The handler state check data in stored in a memory of the tester. Next, the stored data is again transmitted to the tester server to construct a database (S160). Accordingly, the tester server uses the constructed database to allow an engineer and the operator to utilize the handler state check data in real time, thereby effectively monitoring and maintaining the state of the handler.

According to the electrical test system for a semiconductor device of the invention, the handler control conditions are set in a remote control way, rather than manually by an operator, by using the GPIB communication cable. First, the system automatically set the handler control conditions to increase the utilization of the handler CPU and reduce the test time, thereby increasing the test efficiency. Second, errors caused by the operator in the process of manually setting the handler control conditions can be avoided. Third, problems occurring in the handler are collected in real time to construct a database, thereby more effectively monitoring and maintaining the state of the handler.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A test system for a semiconductor device having a handler remote control, the system comprising:
   a tester to test the semiconductor device;
   a handler connected to the tester;
   a tester server to download a test program and a handler remote control program to the tester; and
   communication data transmitted and received between the tester and the handler,
   wherein the communication data comprises communication data for an electrical test of the semiconductor device and communication data for a handler remote control.

2. The system of claim 1, wherein the communication data for the handler remote control comprises a soak time setting data.

3. The system of claim 1, wherein the communication data for the handler remote control comprises a set condition for a retest.

4. The system of claim 1, wherein the communication data for the handler remote control comprises a set condition for a test temperature.

5. The system of claim 1, wherein the communication data for the handler remote control comprises a set condition for a category bin.

6. The system of claim 1, wherein the communication data for the handler remote control comprises a set condition for a loading time.

7. The system of claim 1, wherein the communication data for the handler remote control comprises a condition for a remnant lot.

8. The system of claim 1, wherein the communication data for the handler remote control comprises a set condition for an auto restart.

9. The system of claim 1, wherein the communication data for the handler remote control comprises a set condition for a retest on/off.

10. The system of claim 1, wherein the tester server downloads a handler state check program to the tester and wherein the communication data transmitted and received between the tester and the handler comprises communication data for a handler state check.

11. The system of claim 10, wherein the communication data for the handler state check comprises a handler jam data.

12. The system of claim 10, wherein the communication data for the handler state check comprises error and alarm data of the handler.

13. The system of claim 10, wherein the communication data for the handler state check comprises sorting data of the handler.

14. The system of claim 10, wherein the communication data for the handler state check comprises a temperature stability data of the handler.

15. A method of testing a semiconductor device, comprising:
    downloading a test program suitable to a lot of the target semiconductor device, from a tester server to a tester;
    downloading a handler remote control program suitable to the lot of the target semiconductor device, from the tester server to the tester;
    remotely setting an operation condition of a handler by using the handler remote control program; and
    performing an electrical test of the semiconductor device by using the test program.

16. The method of claim 15, wherein the handler remote control program comprises a routine of setting a soak time, a routine of setting a retest condition, a routine of setting a test temperature and a routine of setting a category bin.

17. The method of claim 15, further comprising:
    downloading a handler state check program suitable to the lot of the target semiconductor device, from the tester server to the tester; and
    performing a handler state check by using the handler state check program.

18. The method of claim 17, wherein the handler state check program comprises a routine of outputting a handler jam data, a routine of outputting a handler error/alarm data, a routine of outputting a handler sorting data, and a routine of outputting a handler temperature stability data.

19. The method of claim 18, wherein the data output from the handler state check program is transmitted from the handler to the tester when the handler malfunctions.

20. The method of claim 17, further comprising:
    constructing a database in the tester server, the database comprising handler state check data.

21. The method of claim 17, wherein the handler state is checked during the electrical test for the semiconductor device.

22. A system for testing a semiconductor device, comprising:
    means for testing the semiconductor device;
    means for setting operation conditions for the semiconductor device under test;
    means for downloading software programs to the means for testing the semiconductor device, the software programs comprising:
       means for performing an electrical test of the semiconductor device; and
       means for remotely setting the operation conditions for the semiconductor device under test; and
    means for communicating between the means for testing the semiconductor device and the means for setting the operation conditions.

23. The system of claim 22, wherein the software programs further comprise means for automatically checking the state of the means for setting the operation conditions of the semiconductor device.

* * * * *